「US010608632B2

United States Patent
Yang et al.

(10) Patent No.: US 10,608,632 B2
(45) Date of Patent: Mar. 31, 2020

(54) INFRARED-BASED GESTURE SENSING AND DETECTION SYSTEMS, AND APPARATUSES, SOFTWARE, AND METHODS RELATING TO SAME

(71) Applicants: Trustees of Dartmouth College, Hanover, NH (US); Carnegie Mellon University, Pittsburgh, PA (US)

(72) Inventors: Xing-Dong Yang, Hanover, NH (US); Jun Gong, West Lebanon, NH (US); Yang Zhang, Pittsburgh, PA (US); Xia Zhou, Hanover, NH (US)

(73) Assignees: Trustees of Dartmouth College, Hanover, NH (US); Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 16/163,201

(22) Filed: Oct. 17, 2018

(65) Prior Publication Data
US 2019/0115916 A1    Apr. 18, 2019

Related U.S. Application Data

(60) Provisional application No. 62/573,412, filed on Oct. 17, 2017.

(51) Int. Cl.
| | |
|---|---|
| *H03K 17/94* | (2006.01) |
| *G06F 1/16* | (2006.01) |
| *G06F 3/01* | (2006.01) |
| *G06N 20/00* | (2019.01) |
| *G06F 3/03* | (2006.01) |

(52) U.S. Cl.
CPC ........... *H03K 17/941* (2013.01); *G06F 1/163* (2013.01); *G06F 3/011* (2013.01); *G06F 3/017* (2013.01); *G06F 3/0304* (2013.01); *G06N 20/00* (2019.01)

(58) Field of Classification Search
CPC ....... H03K 17/941; G06N 20/00; G06F 1/163
See application file for complete search history.

(56) References Cited

U.S. PATENT DOCUMENTS

| | | | |
|---|---|---|---|
| 2015/0070181 A1* | 3/2015 | Fadell | G08B 21/22 340/628 |
| 2016/0364009 A1* | 12/2016 | Lemberger | H04N 21/4424 |
| 2017/0098068 A1* | 4/2017 | Mantri | G06F 21/36 |
| 2017/0254703 A1* | 9/2017 | Purohit | G01J 5/0025 |
| 2018/0288161 A1* | 10/2018 | Saxena | H04L 67/22 |
| 2019/0041994 A1* | 2/2019 | Cho | G06F 3/017 |

* cited by examiner

*Primary Examiner* — Hugh Maupin
(74) *Attorney, Agent, or Firm* — Oblon, McClelland, Maier & Neustadt, L.L.P.

(57) ABSTRACT

An infrared (IR)-based gesture sensing and detection system that includes at least one IR sensor for sensing micro gestures of one or more heat-radiating bodies made within a gesture-sensing region located proximate to the IR sensor. Each unique micro gesture may be used as a control gesture for controlling one or more controllable devices. Non-limiting examples of controllable devices include smart wearable device, handheld computing devices, and smart appliances, among many others. In some embodiments, each IR sensor is a passive IR sensor based on a pyroelectric material, and the IR-based gesture sensing and detection system is configured to consume minimal power to operate.

25 Claims, 6 Drawing Sheets

INFRARED-BASED GESTURE SENSING AND DETECTION SYSTEMS, AND APPARATUSES, SOFTWARE, AND METHODS RELATING TO SAME

RELATED APPLICATION DATA

This application claims the benefit of priority of U.S. Provisional Patent Application Ser. No. 62/573,412, filed Oct. 17, 2017, and titled "Gesture Recognition Using Infrared Sensing," which is incorporated by reference herein in its entirety.

FIELD OF THE INVENTION

The present invention generally relates to the field of human-machine interfaces. In particular, the present invention is directed to infrared-based gesture sensing and detection systems, and apparatuses, software, and methods relating to same.

BACKGROUND

Contactless gesture-controlled devices recognize and interpret movements of the human body in order to interact with and control these devices without direct physical contact. Traditional gestural input methods, which often require moving a finger, hand, or even an entire arm in mid-air, may induce fatigue over time. Fine-grained, or "micro-gestures," may introduce relatively less fatigue over time.

However, tracking fine-grained gestures, for example, finger and thumb-tip gestures, remains very challenging due to the small magnitude of digit motions and frequent occurrences of self-occlusion. Existing studies have exploited magnetic sensing, which achieves a relatively high tracking precision but requires fingers to be instrumented with magnets and sensors. Another project, the Google Soli project, explored the use of millimeter-wave radar to sense subtle finger movement without instrumenting the user. The energy consumption of the active sensor in such a system, however, is a concern, especially for small wearable devices, such as smartwatches and augmented reality glasses, among others.

SUMMARY OF THE DISCLOSURE

In one implementation, the present disclosure is directed to an apparatus. The apparatus includes at least one passive infrared (PIR) sensor configured and positioned to define a gesture-sensing region in free space proximate to the at least one PIR sensor, wherein the at least one PIR sensor includes circuitry that generates a gesture-response signal in response to the at least one PIR sensor sensing a micro gesture made with a heat-radiating object within the gesture-sensing region; a processor designed and configured to execute machine-executable instructions, wherein the process is in communication with the circuitry so as to receive the gesture-response signal; and memory in operative communication with the processor and containing machine-executable instruction for execution by the processor, wherein the machine-executable instructions include machine-executable instructions that: extract at least one feature from the gesture-response signal; compare the at least one feature to a model that models a control-gesture set so as to determine whether or not the micro gesture matches a control gesture of the control-gesture set; and when the micro gesture matches the control gesture, generate an indication that corresponds uniquely the control gesture matched.

In another implementation, the present disclosure is directed to a method of controlling a controllable device responsive to a micro gesture made by a user with at least one heat-radiating object. The method includes sensing occurrence of the micro gesture using at least one passive infrared (PIR) sensor so as to generate a gesture-response signal; extracting a plurality of features from the gesture-response signal; comparing the plurality of features to a model that models a control-gesture set so as to determine whether or not the micro gesture matches a control gesture of the control-gesture set; and when the micro gesture matches the control gesture, generating an indication that corresponds uniquely to the control gesture matched.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

1. Overview

Figure 1:
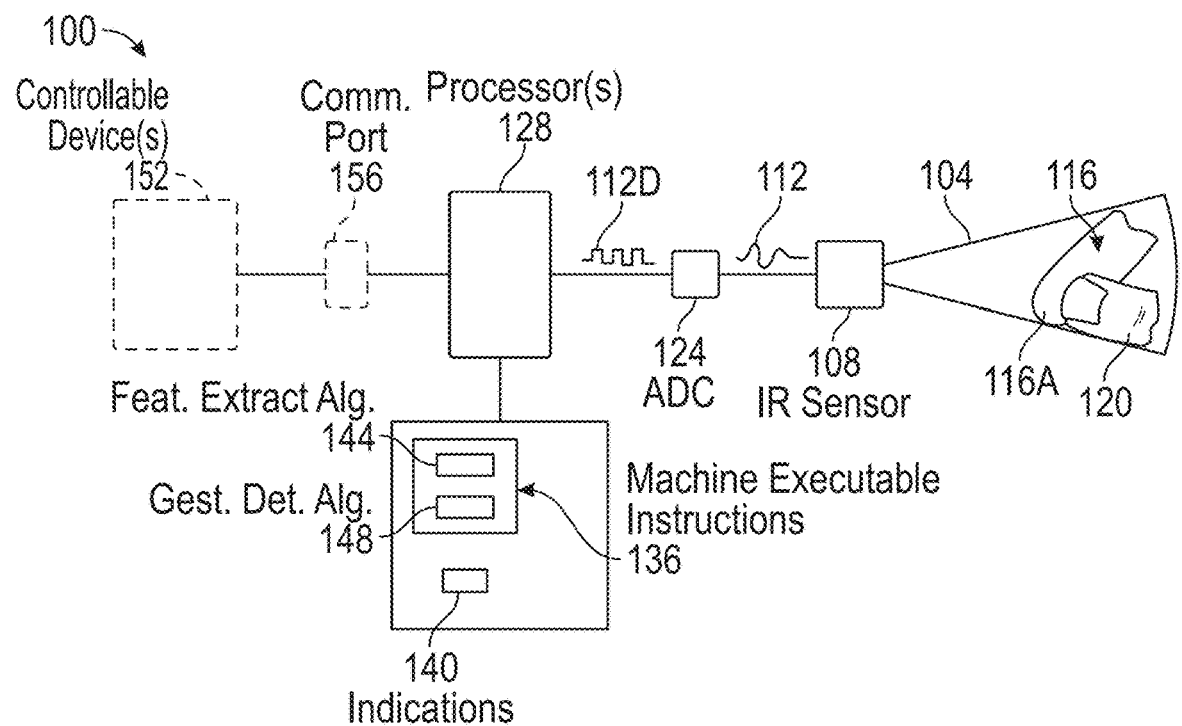
FIG. 1 is a high-level diagram of an infrared (IR)-based gesture sensing and detection system made in accordance with the present disclosure.

In some aspects, the present disclosure is directed to infrared (IR)-based gesture sensing and detection systems, such as IR-based gesture sensing and detection system 100 of FIG. 1, that are designed and configured to sense and detect micro gestures made by a human (or, more generally, a primate) user within a gesture-sensing region, such as gesture-sensing region 104 of the IR-based gesture sensing and detection system. Referring to FIG. 1 as an example, IR-based gesture sensing and detection system 100 includes at least one IR sensor 108 designed and configured to generate an electrical signal 112 that varies based on movement of one or more IR-radiating bodies, such as one or more fingers and/or thumb, here finger 116 and thumb 120, within sensing range of the IR sensor(s). For convenience, this electrical signal is referred to herein and the appended claims as a "gesture-response signal" 112. Examples of IR sensor types that may be used for the one or more IR sensors 108 include pyroelectric types, thermopile types, and quantum-well types, among others.

Passive IR (PIR) sensors based on pyroelectric materials are well known in the field of presence detectors that detect movement of humans, other animals, and/or other IR-radiating bodies, within spaces covered by the sensors. Such presence sensors are used for any of a variety of reasons, including intruder detection and triggering of lighting or heating, ventilating, and air conditioning systems, among other things. As described below in more detail, some embodiments of IR-based gesture sensing and detection system 100 may utilize one or more commercial off-the-shelf (COTS) PIR sensors and some embodiments may utilize one or more custom-built PIR sensor, among any other suitable IR sensor type.

Figure 2:
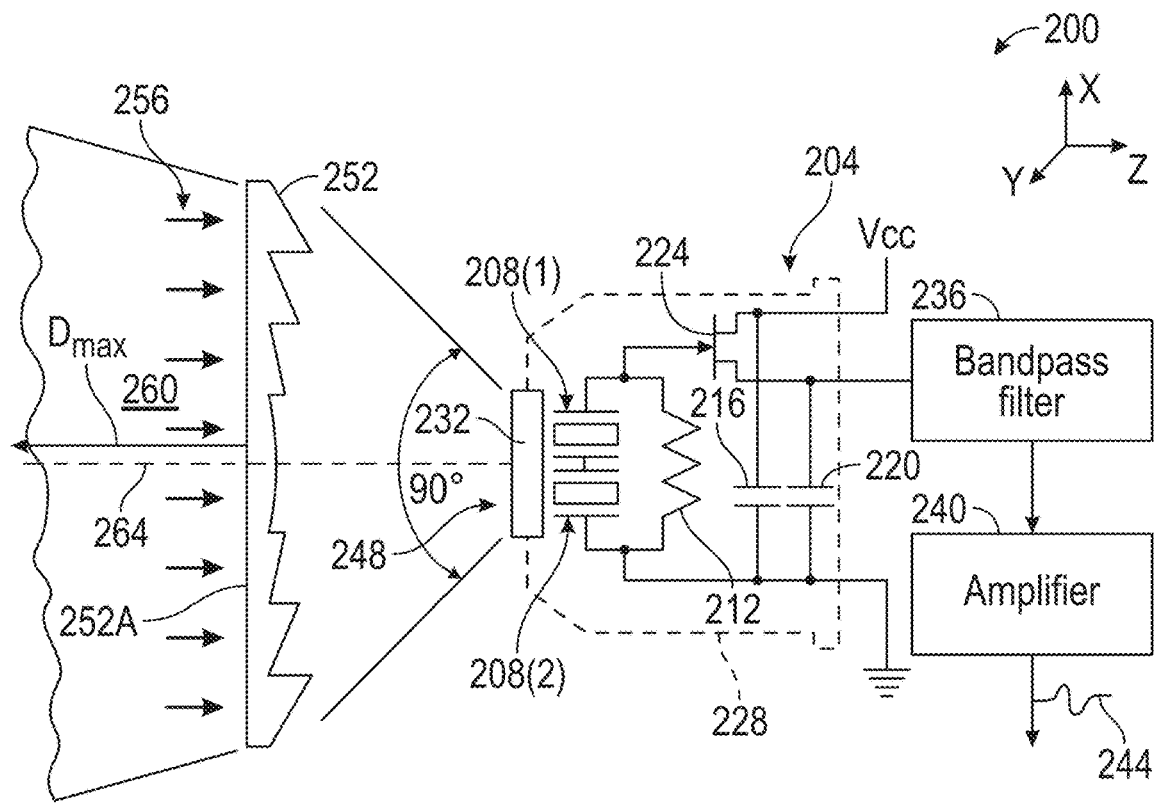
FIG. 2 is diagram of an example passive IR sensor suitable for use in an IR-based gesture sensing and detection system of the present disclosure, such as the IR-based gesture sensing and detection system of FIG. 1.

Since pyroelectric-based PIR sensors are well-known in other fields, are inexpensive, and consume little power, basic components of these sensors are well-suited for use in IR sensor(s) 108 in some embodiments of IR-based gesture sensing and detection system 100. PIR sensors are sensitive to thermal radiation emitted by the human body, and they can detect tiny deviations from the thermal equilibrium of the surrounding environment. FIG. 2 illustrates an example PIR sensor 200 having sensing circuitry 204 that includes a pair of sensing elements 208(1) and 208(2) composed of pyroelectric crystals, a material that generates a surface electric charge when exposed to heat in the form of IR radiation. In this example, sensing elements 208(1) and 208(2) and supporting electronics, here a resistor 212, two capacitors 216 and 220, and a transistor 224, of sensing circuitry 204 are contained in an optional housing 228 that can be conveniently mounted to a circuit board (not shown). Other PIR sensors can have constructions different from the construction of PIR sensor of FIG. 2. PIR sensor 200 may be tuned for human detection by adding a bandpass filter window 232 that passes only the IR wavelengths emitted by a human body (e.g., 8 µm to 14 µm). In the presence of a thermally radiating object (e.g., a finger), PIR sensor 200 converts the thermal radiation into an electrical current proportional to the difference in temperature between the object and its surrounding environment.

In this example, PIR sensor 200 has sensing elements 208(1) and 208(2) arranged side by side and electrically connected to a bandpass filter 236 to filter unwanted components of the output signal from sensing circuitry 204. Sensing elements 208(1) and 208(2) are also electrically connected to a differential amplifier 240 to cancel common-mode noise caused by environmental temperature change, vibration, and sunlight, since these simultaneously affect both sensing elements. The output of the differential amplifier 240 is a gesture-response signal 244.

When an IR-radiating object (not shown) passes by PIR sensor 200, it is observed by one of sensing elements 208(1) and 208(2) first and then by the other of the sensing elements, causing a positive differential change between the two crystals, thereby generating, for example, a sinusoidal swing in gesture-response signal 244. When the IR-radiating object passes by PIR sensor 200 in the opposite direction, the IR radiation from it intercepts sensing elements 208(1) and 208(2) in a reverse order, thus generating a negative differential change, for example, a flip of the sinusoidal swing within gesture-response signal 244. When the change in the sensed thermal IR has stabilized between sensing elements 208(1) and 208(2), gesture-response signal 244 returns to its baseline voltage. It is noted that some PIR sensors, such as PIR sensor 200 of FIG. 2, are less responsive to motion in directions towards and away from the front (front 248 in FIG. 2) of the PIR sensor, since the motion along z-axis causes a smaller difference in temperature between sensing elements 208(1) and 208(2).

To improve the responsiveness of PIR sensor 200 to small movements of micro gestures, a lens 252, such as the Fresnel lens shown in FIG. 2, can be added to concentrate incoming IR radiation 256 on sensing elements 208(1) and 208(2). It is noted that while a Fresnel lens is depicted in FIG. 2, lens 252 can be another type of lens, such as a simple lens or a compound lens. Fresnel lenses can be effective, though, because they are relatively low cost and use less material that a corresponding simple lens having similar optical parameters. It may be possible to further improve sensitivity by splitting lens 252 into multiple zones, each with its own sub-lens (not shown) focused on both sensing elements 208(1) and 208(2). A possible downside of using a multi-zone Fresnel lens, however, is that an objects movement direction may not be able to be be reliably detected due to the mixture of multiple signals coming from differing zones. This situation can be exacerbated when a user does not make their gestures in precisely the same location in the x-y plane every time, which allows for much variability in which sub-lens(es) is/are dominating the signals and the attendant complications for the machine learning and feature extraction algorithms described below in detail. To avoid these issues, a single-zone lens was used in the example instantiation described below.

Lens 252 may be designed and configured to limit the extent of the gesture-sensing region 260. For example, the maximum focal distance of lens 252 may be selected so that the maximum sensing distance, Dmax, as measured from the front 252A of lens 252 along a central sensing axis 264, is less than the minimum anticipated distance between the front of the lens and a heat-radiating object, such as another person, that might interfere with proper detection of the micro gestures made within gesture-sensing region or cause false positives. For example, lens 252 may be configured so that Dmax is 100 cm or less, 40 cm or less, 30 cm or less, 10 cm or less, or 5 cm or less, depending upon design parameters, such as the type(s) of controllable device(s) with which PIR sensor 200 is used and the anticipated environment of such device(s), among others. It is noted that while this example is directed to a PIR type sensor, lenses for other types of IR sensors can be similarly designed and configured to limit the extent of the corresponding respective gesture-sensing regions.

Referring again to FIG. 1, IR-based gesture sensing and detection system 100 also includes an analog-to-digital converter (ADC) 124 for converting analog gesture-response signal 112 into a digitized version 112D. It is noted that ADC may or may not be part of IR sensor 108, depending on packaging. IR-based gesture sensing and detection system 100 further includes one or more processors (collectively represented as processor 128) and memory 132 in operative communication with the processor and containing machine-executable instructions 136 for, among other things, executing algorithms and associated tasked for detecting the occurrence of each micro gesture that a user performs within gesture-sensing region 104. Processor 128 may comprise any one or more processing devices, such as one or more microcontrollers, one or more central processing units, one or more processing cores of a system on a chip, one or more processing cores of an application specific integrated circuit, and/or one or more field programmable gate arrays, among others. Memory 132 can be any type(s) of suitable machine memory, such as cache, RAM, ROM, PROM, EPROM, and/or EEPROM, among others. Machine memory can also be another type of machine memory, such as a static or removable storage disk, static or removable solid-state memory, and/or any other type of persistent hardware-based memory. Fundamentally, there is no limitation on the type(s) of memory other than it be embodied in hardware. Machine-executable instructions 136 compose the software (e.g., firmware and/or application(s) or portion(s) thereof) that utilize IR sensor 108 to determine occurrences of micro gestures within gesture-sensing region 104 and to output indications 140 of such occurrences for use.

Machine-executable instructions 136 include machine-executable instruction for performing a feature-extraction algorithm 144 that extracts one or more features from gesture-response signal 112D that either singly or collectively can be uniquely associated with a corresponding occurrence of a micro gesture. Machine-executable instructions 136 also include machine-executable instructions for performing a gesture-detection algorithm 148 trained to distinguish occurrences of differing micro gestures from one another based on the feature(s) that feature-extraction algorithm 144 extracts from gesture-response signal 112D. Examples of feature-extraction algorithms and gesture-detection algorithms suitable for use, respectively, as feature-extraction algorithm 144 and gesture-detection algorithm 148 are discussed below in Sections 2.4, 2.5, and 3.3.4, among others.

Generally, however, and in some embodiments, gesture-detection algorithm 148 is configured to compare features extracted from gesture-response signal 112D to a model that models a set of control gestures that IR-based sensing and detection system 100 is configured to detect. Such a control-gesture set would typically represent at least the micro gestures that will be used to control one or more controllable devices (collective represented as controllable device 152). Each controllable device 152 may be any suitable device capable of being controlled via gestural input.

During operation of IR-based sensing and detection system 100, gesture-detection algorithm 148 so configured compares the features, extracted in real-time, from gesture-response signal 112D to feature sets within the model, with the goal of determining which, if any, micro gesture a user has made within gesture-sensing region 104. When gesture-detection algorithm 148 has found a match between a user's micro gesture and one of control gestures within the model, IR-based sensing and detection system 100 outputs, in real-time, an indication 140 corresponding to the matched control gesture. This indication 140 effectively notifies controllable device(s) 152 that a user has made the particular control gesture. Each controllable devices uses that indication to respond to the control gesture in a pre-determined manner. For example, if the particular control gesture corresponds to pressing a virtual button, then each controllable device 152 responds to the corresponding indication in the manner it has been programmed to respond to a pressing of a virtual button. Those skilled in the art will readily understand that there are many possible micro gestures that can be used for control gestures and that the response that each controllable device 152 can be programmed to make in response to each control gesture is virtually limitless, since there are so many controllable devices and software applications therefor that can be controlled using control gestures detectable using an IR-based sensing and detection system of the present disclosure, such as IR-based sensing and detection system 100 of FIG. 1.

As will become apparent after reading this entire disclosure, an IR-based gesture sensing and detection system of the present disclosure, such as IR-based gesture sensing and detection system 100 of FIG. 1, can be embodied into any one of a wide variety of controllable devices including, but not limited to, wearable "smart" devices (e.g., smartwatches, fitness trackers, smart jewelry, wearable computers, augmented reality gear, virtual reality gear, etc.), smart appliances (e.g., kitchen and other household and commercial appliances, etc.), personal computers (e.g., laptop computers, tablet computers, and desktop computers) smartphones, wireless security devices (e.g., cameras, smart locks, etc.), and smart controls (e.g., smart thermostats, smart lighting controllers, etc.), among many other devices. Fundamentally, there is no limitation on the type of controllable devices that can be controlled via gestural input sensed and detected using an IR-based gesture sensing and detection system of the present disclosure other than that they are suitable for controlling by such gestural input.

It is noted that some or all components of an IR-based gesture sensing and detection system, such as IR-based gesture sensing and detection system 100, may be incorporated into a controllable device (e.g., controllable device 152) that it is used for controlling. For example, the entirety of IR-based gesture sensing and detection system 100 may be integrated into the controllable device. Taking a smartphone as an example of controllable device 152 and referring to FIG. 1, processor 128 and memory 132 may be the processor and memory of the smartphone, with IR sensor 108 being internal to the smartphone and having its front face (see, e.g., front face 252A of FIG. 2) facing outward from the smartphone, such as alone a lateral side of the smartphone. In other implementations, all of the components of IR-based gesture sensing and detection system 100, including processor 128 and memory 132, may be located external to controllable device 152, with the IR-based gesture sensing and detection system communicating indications 140 to the device via a suitable communication port 156, such as via a wired or wireless communications between the IR-based gesture sensing and detection system and the device. For example, IR-based gesture sensing and detection system 100 may be embodied in a self-contained user input device 160, such as in a manner similar to a mouse or track pad, that can be used, for example, for controlling a laptop or desktop computer. Such a user-input device could be configured differently, with only IR sensor 108 and ADC 124 being contained in the user-input device, with gesture-response signal 112 being communicated to the device being controlled via communication port 156. In this deployment, processor 128 and memory 132 may be the processor and memory of the controllable device. Other arrangements and deployments are possible.

Figure 3:
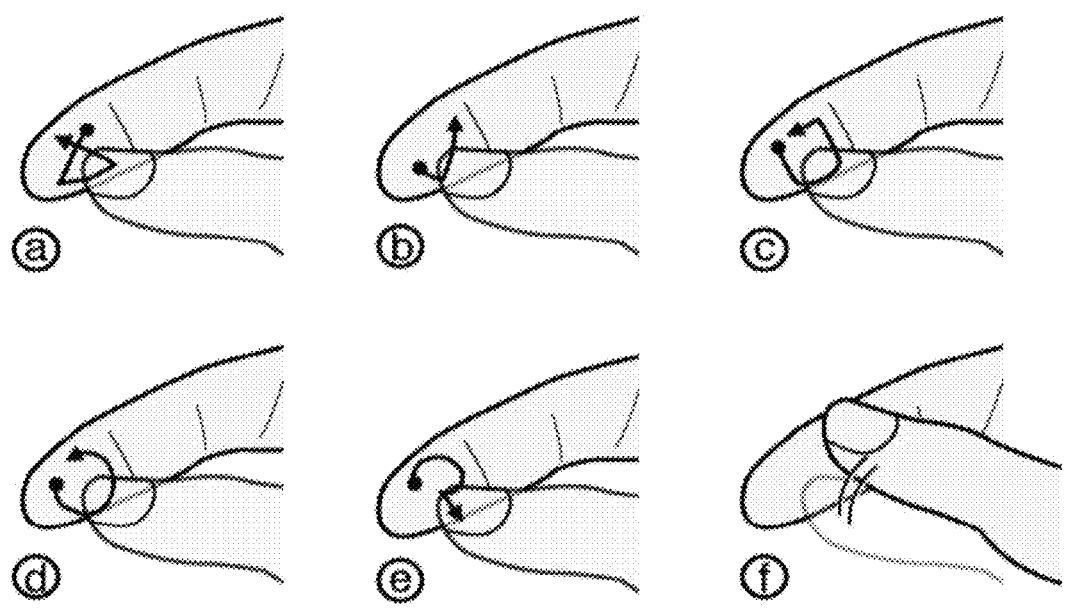
FIG. 3 contains diagrams illustrating a set of six example digit-tip-based micro gestures that can be used with an IR-based gesture sensing and detection system of the present disclosure, such as the IR-based gesture sensing and detection system of FIG. 1.

Finger 116 and thumb 120 are included in FIG. 1 to illustrate one example of how a user can make certain micro gestures for controlling controllable device 152. In this example, the user makes any one or more of a plurality of differing micro gestures by contacting thumb 120 with a region of finger 116, such as the fingertip 116A, and moving the thumb relative to the finger, or vice versa, while the thumb and finger remain in contact with one another, so as to virtually "draw," with the thumb, differing shapes or patterns, i.e., making differing micro gestures, upon the finger. Some non-limiting examples of such gestures are illustrated in FIG. 3 in the context of virtually drawing on fingertip 116A. However, many other micro gestures are possible, including micro gestures illustrated in connection with the Project Soli (https://atap.google.com/soli/) by Google LLC, Mountain View, Calif. As seen from FIG. 3, each micro gesture illustrated there involves moving thumb 120 largely within the confines of fingertip 116A such that the range of movement is contained with a region of a plane that is less than about 20 mm×20 mm (the average human fingertip ranging from about 16 mm to about 20 mm). It is noted that finger 116 can be any one of the fingers on the same hand as thumb 120, though the index finger is typically most convenient.

Micro digit gestures offer new opportunities for natural, subtle, fast, and unobtrusive interactions in various controllable devices and their software applications, including wearable, mobile, and ubiquitous computing devices and applications. For example, gesturing a thumb-tip against the tip of the index finger is a natural method of performing input, requiring little effort from users because the index finger serves as a stabilizing gesturing platform that naturally provides haptic feedback. Generally, the user of two digits, such as finger 116 and thumb 120 of the same hand, allows the user to largely fix one of the digits in free-space within gesture sensing region 104 to provide a stabilizing gesturing platform for the micro gesturing and then use the other digit to make the micro gestures. That said, two digits are not required, especially if another stabilizing gesturing platform is present within gesture-sensing region 104, although having a stabilizing gesturing platform for making micro gestures is not strictly required. Indeed, a micro gesture can be made by a single object, such as a hand digit, without contacting any stabilizing gesturing platform.

Figure 4:
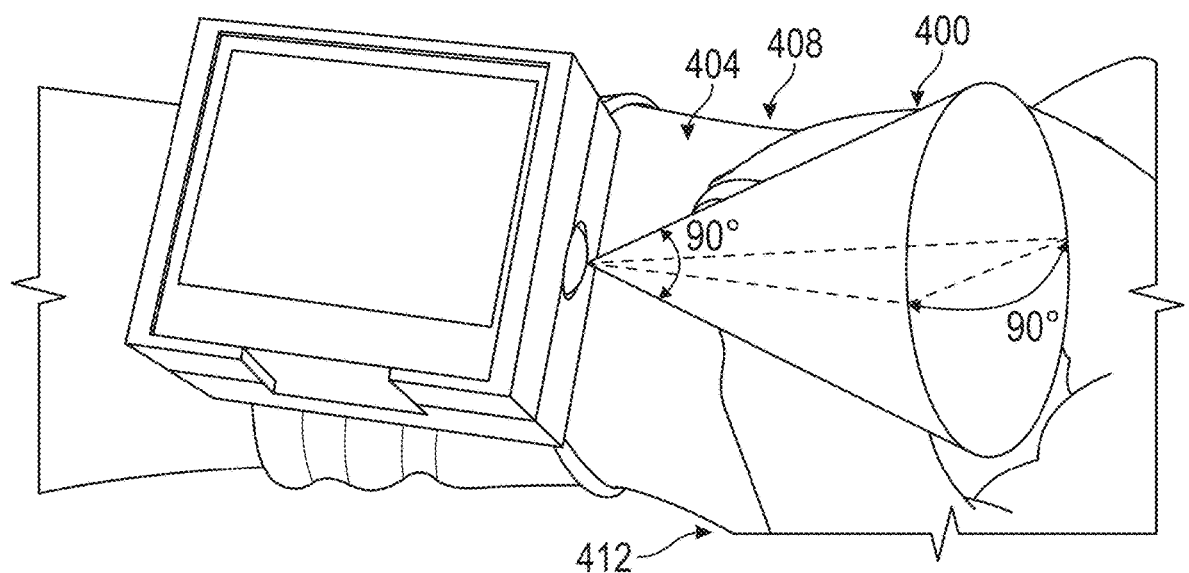
FIG. 4 is a photograph illustrating a prototype smartwatch arrangement in which the smartwatch includes an IR-based gesture sensing and detection system of the present disclosure, such as the IR-based gesture sensing and detection system of FIG. 1.

That said, as an example of having a stabilizing gesturing platform other than a digit, envision the wrist-mounted prototype smartwatch arrangement of FIG. 4 with the gesture-sensing region 400 containing a portion of the dorsal side 404 of the wearer's left wrist 408 and/or hand 412. In such an arrangement, the wearer can use a finger, such as the index finger 416, of their right hand to make one or more suitable micro gestures with the tip of that finger in contact with the wrist 408 and/or hand 412 on the portion of dorsal side 404 that is within gesture-sensing region 400. In this manner, dorsal side 404 of wrist 408 and/or hand 412 functions as a stabilizing gesturing platform.

Figure 5:
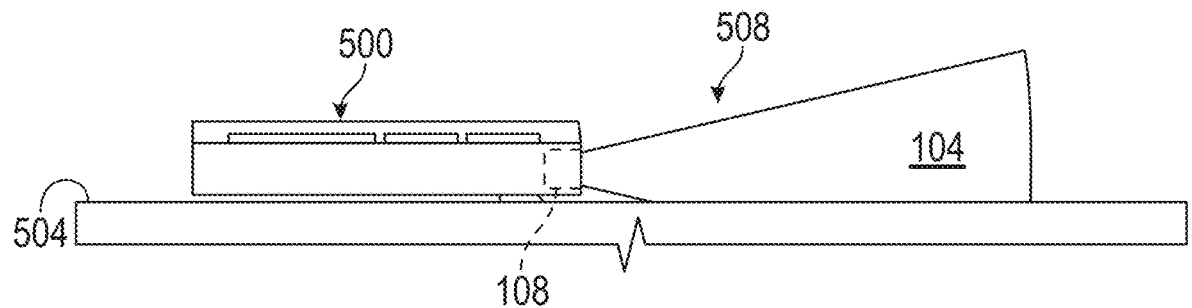
FIG. 5 is an elevational partial view of a peripheral computer keyboard that incorporates components of an IR-based gesture sensing and detection system of the present disclosure, such as the IR-based gesture sensing and detection system of FIG. 1.

As another example and referring to FIG. 5, and also to FIG. 1, one or more components of IR-based gesture sensing and detection system 100 (FIG. 1) are integrated into a peripheral keyboard 500 for a desktop computer (not shown). In this example, keyboard 500 is resting on a surface 504 having an unobstructed region 508 adjacent to the right-hand side of the keyboard. IR sensor 108 is mounted within keyboard 500 on the right-hand side of the keyboard and faces rightward so that gesture-sensing region 104 is on the right-hand side of the keyboard. In this example, a user (not shown) can, for example, use a single digit, for example, index finger, of their right hand to make micro gestures within gesture-sensing region 104 (FIG. 5) with the digit in contact with surface 504 as if the user were drawing on the surface with that digit. In this manner, the region of surface 504 within gesture-sensing region 104 functions as a stabilizing gesturing platform for the digit used to make the micro gestures. It is noted that the user need not necessarily have only a single digit of the gesturing hand within gesture-sensing region 104. For example, the user could hold their index and middle fingers together in an extended manner, while also flexing their ring and pinky fingers and contacting the tip of their middle finger with surface 504. It is also noted that IR-based sensing and detection system 100 as deployed in keyboard 500 could be configured to additionally or alternatively, sense and detect other micro gestures, such as multiple-digit gestures, including micro gestures performed in midair. Of course, many other stabilizing gesturing platforms can be used.

It is noted above that for digit-tip-based micro gestures the gestures typically occur with the movement of any given point on the moving digit staying within a generally planar region of about 20 mm×20 mm. However, micro gestures suitable for use with an IR-based sensing and detection system of the present disclosure, such as IR-based sensing and detection system 100 of FIG. 1, need not be so limited. For example, the micro gestures need not be contained to being performed within a plane or nearly a plane. Rather, they can be composed of movement in all three dimension if recognition of such micro gestures is desired. As another example, the spatial extent of micro gestures need not be a bounding rectangle having maximum dimensions of about 20 mm×20 mm. The bounding region may be three-dimensional, a shape other than rectangular, and/or of a different size. Practically speaking, the bounding region (e.g., circular, spherical, rectangular, rectangular prismatic, elliptical, ellipsoidal, etc.) for the extent of a micro gesture may have a maximum diameter (i.e., distance between two points on opposing portions, regardless of shape) of about 150 mm, although more typically the maximum diameter of the bounding region for a given set of micro gestures will be on the order of less than about 80 mm, less than about 50 mm, or less than about 30 mm.

In other aspects, the present disclosure is directed to apparatuses, methods, and software relating to IR-based gesture sensing and detection systems disclosed herein. Such apparatuses include, but are not limited to, controllable devices that integrate within them IR-based gesture sensing and detection systems of the present disclosure, as well as combinations of controllable and other devices when components of the IR-based gesture sensing and detection systems are distributed throughout two or more devices, such as in the context of a computer and a peripheral device. Methods disclosed herein include methods of operating and using an IR-based gesture sensing and detection device of the present disclosure and methods of controlling one or more controllable devices using an IR-based gesture sensing and detection system of the present disclosure. Software may include any of the machine-executable instructions that perform any function unique to the operation of an IR-based gesture sensing and detection system of the present disclosure and/or machine-executable instructions directed to the control of one or more controllable devices using gestural input sensed and detected using an IR-based gesture sensing and detection system of the present disclosure. Details of such apparatuses, methods, and software are described throughout the present disclosure, including the original appended claims.

2. Example IR-Based Gesture Sensing and Detection System

An instantiation of an IR-based gesture sensing and detection system was created using customized hardware and software. This section describes that instantiation.

2.1 Example Gesture Set

The example instantiation of an IR-based gesture sensing and detection system was design and experimented with using a set of micro thumb-tip gestures. In this example, micro thumb-tip gestures are performed by moving the thumb tip against the tip of the index finger, which is natural, subtle, fast, and unobtrusive. While the design space of micro thumb-tip gestures is large, the present example focused exploration on free-form shape gestures carried out on the distal segment of the index finger, as it is the most common and intuitive way to perform the gestures. Since moving the thumb on the tip of the index finger on the same hand resembles gesturing on a touchscreen, five gestures were chosen from known unistroke gestures shown in conventional touchscreen devices to be useful on touchscreen devices, such as the smartwatch 400 illustrated in FIG. 4.

To ensure diversity, unistroke gestures selected are made with straight lines and corners of different degrees (counter-clockwise triangle, check mark, and counter clockwise rectangle), one having a curved path (counter clockwise circle) and one mixing a curve, straight line, and corner (question mark). A finger rub gesture known in the art was also selected. Although this set of gestures is not exhaustive, it appears to be, so far, the largest micro-gesture set that has been used to validate a sensing technique.

2.2 PIR Sensor and Fresnel Lens

The hardware of this example was optimized for sensing finger motion close to the PIR sensor. For this, a single-zone Fresnel lens (IML—from Murata Manufacturing Co.) and a PIR sensor (IRA-E710 from Murata Manufacturing Co.) without a built-in amplifier and bandpass filter were selected. In this example, a single-zone Fresnel lens was chosen over a multiple-zone lens to preclude interference from multiple monitoring zones. As illustrated in FIG. 2 relative to PIR sensor 200, the horizontal and vertical fields of view of the PIR sensor are both 90 degrees. As noted above, FIG. 4 shows a smartwatch prototype augmented with the present instantiation of IR-based gesture sensing and detection system. A pilot study with three participants suggested that the orientation of the pyroelectric crystal elements of the PIR sensor does not affect gesture recognition accuracy, so in the experiments the elements were oriented parallel to the top of a table.

2.3 Sensing and Detection Circuitry

Figure 6:
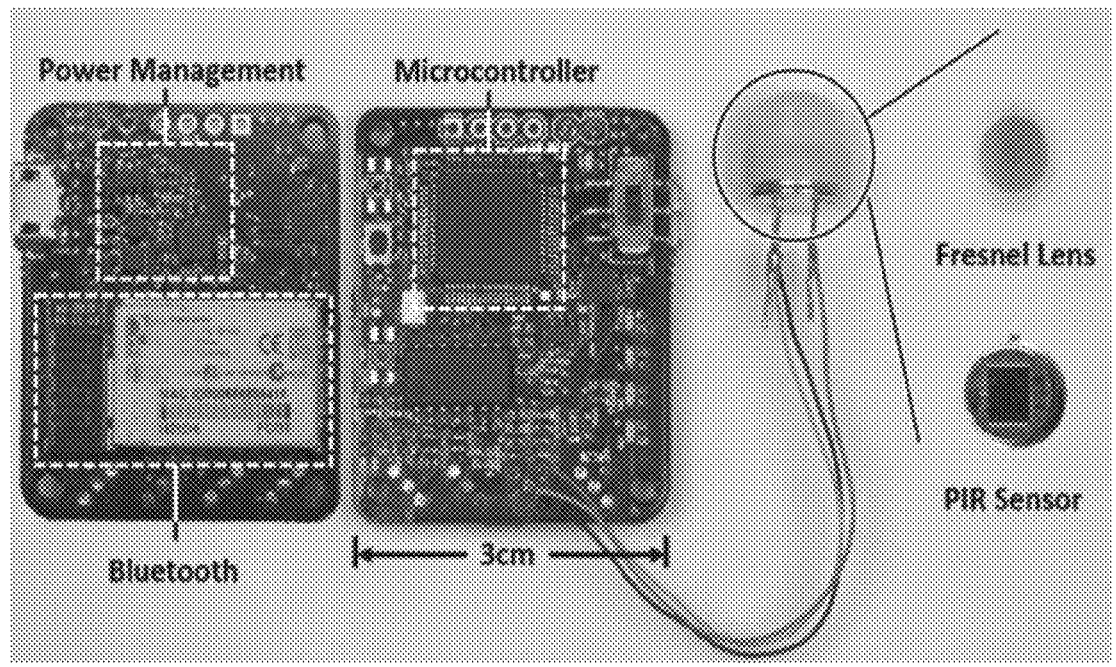
FIG. 6 is a photograph illustrating components of an example instantiation of an IR-based gesture sensing and detection system of the present disclosure.

A customized sensing and detection board (FIG. 6) was built around a Cortex M4 microcontroller (MK20-DX256VLH7) running at 96 MHz, powered by TEENSY® 3.2 firmware available from PJRC.COM LLC, Sherwood, Oreg. The board had an LM324 based ADC preamp, a power management circuit, and a BLUETOOTH® radio module. To reduce the dominant noise (50 kHz-300 kHz) caused by powerline and fluorescent light ballasts, a bandpass filter having cut-off frequencies of 1.59 Hz and 486.75 Hz was used. The relatively wide bandwidth provided flexibility to explore sampling rates. After the noise was removed, the input signal was amplified with a gain of 33 and biased by AREF/2 (1.5 V) to preserve the fidelity of the analog signal. The gain value was carefully tuned to have an optimal sensing range of approximately 0.5 cm to 30 cm away from the PIR sensor. This design mitigated the background thermal infrared signals from a human body, minimizing the impact on the foreground finger gesture signal.

Although existing literature suggests that the gesture-response signals from the PIR sensor should be better sampled at 10 Hz for detecting human body movement, it was found that 20 Hz worked better in this example for the micro finger gestures sensed in the experiments (see Section 3, below). This is because the frequency of PIR signals generated by nearby-finger movement was between 2 Hz and 10 Hz. The gesture-response signals were sent to a laptop computer through a BLUETOOTH® radio link for further computation. In total, the prototype IR-based gesture sensing and detection system costed $24. It is noted that an IR-based gesture sensing and detection system of the present disclosure can be made smaller and less expensive in high-volume commercial applications.

2.4 Machine Learning

Figure 10:
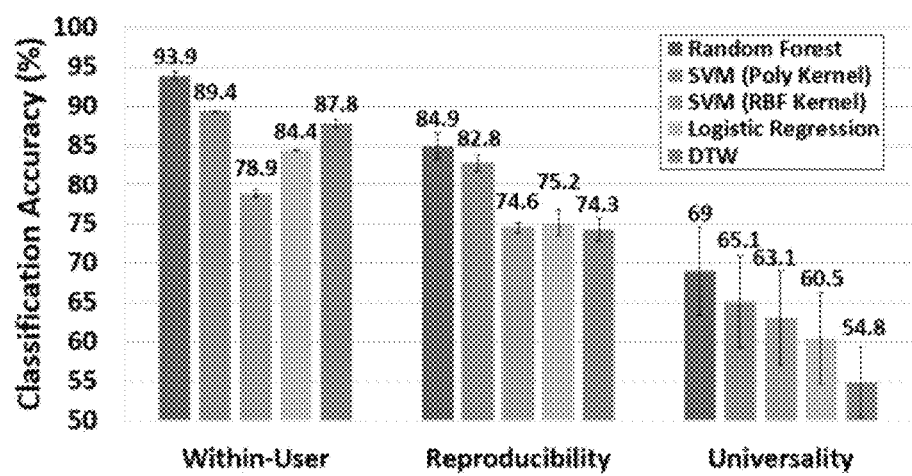
FIG. 10 is a graph illustrating recognition accuracy under various prediction methods based on the six digit-type gestures illustrated in FIG. 3 from test results performed using the example instantiation of the IR-based gesture sensing and detection shown illustrated in FIG. 6.

In this example, machine learning was used to classify thumb-tip gestures. While there are many options for classification algorithms (such as Hidden Markov Models and Convolutional Neural Networks), many of them are computationally expensive and therefore potentially unsuitable for real-time applications on low-power platforms such as wearable smart devices, such as a smartwatch, among others. The aim in the current example was to strike a balance between recognition accuracy and computation efficiency. As such, the candidate gesture recognition methods were narrowed to Random Forest, Support Vector Machine, and Logistic Regression. After comparing their recognition accuracy (e.g., results shown in FIG. 10), it was decided to use Random Forest in the example implementation.

2.5 Feature Extraction

Figure 7:
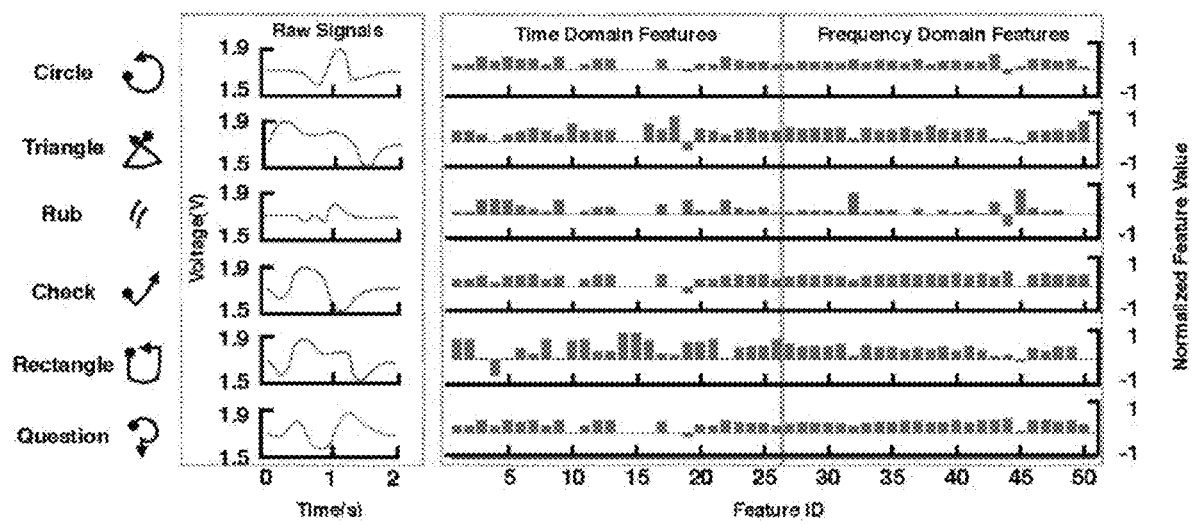
FIG. 7 are diagrams illustrating the top 50 signal features of the six digit-tip gestures illustrated in FIG. 3.

The extraction of relevant features from the gesture-response signal from the PIR sensor is important to the success of an IR-based gesture sensing and detection system of the present disclosure. The challenge, however, lies in the fact that selecting the right feature set is not obvious. Although features like Fast-Fourier Transformation (FFT), peak amplitude, or first-order derivative are commonly used in various applications, it was found in the context of the present example that using these features directly to train a Random Forest model led to a rather low accuracy, and none of the existing research provided insights into suitable features for characterizing micro thumb-tip gestures using pyroelectric infrared signals. Consequently, it was decided to use a COTS feature extraction toolbox to extract hundreds of features from time and frequency domains. The gesture-response signals were sampled, made equal length to one another using zero padding, and normalized. Features were then extracted and used to train and test the models. Results are reported in the later sections, below. The Table, below, shows the top-50 most effective and relevant features ranked by Random Forest. Interestingly, half of the top-50 were from the time domain and the remaining half were from the frequency domain. This confirmed that data from both domains are treated equally important by the Random Forest algorithm. FIG. 7 presents the normalized values of the top-50 features (same order as in the below Table) and raw signals for the six thumb-tip gestures.

| | |
|---|---|
| Time Domain (26 features) | Statistical Functions (21): Sum, Mean, Median, Standard Deviation, Skewness, Quantiles (4), Kurtosis, Longest strike above/below mean, Count above/below mean, mean autocorrelation, mean absolute change quantiles (3), autocorrelation of lag, ratio of unique values, Variance |
| | Peak (1): Number of values between max and min |
| | Entropy (3): Binned Entropy, Sample Entropy, Approximate Entropy |
| | Energy (1): Absolute energy |
| Frequency Domain (24 features) | Continuous Wavelet Transform (21) |
| | Fast Fourier Transform (1) |
| | Autoregressive (1) |
| | Welch (1) |

3. Experimental Results

A goal of an experimental study conducted using the example IR-based gesture sensing and detection system described in Section 2, above, was to evaluate the gesture-recognition accuracy of that system as well as its robustness against individual variance and among different users.

3.1 Participants

Ten right-handed participants (average age: 26.4, two female) were recruited to participate in this study. Participants' finger temperatures measured between 24.1° C. and 34.4° C. (SD=4.6). The room temperature was 24° C.

3.2 Data Collection

Each participant was instructed to sit in front of the PIR sensor placed on a desk. Before a session started, participants were given several minutes to learn the six unistroke micro figure gestures (triangle, rectangle, circle, question mark, check mark, and finger rub) described above in Section 2.1. After the short training session, each participant performed the gestures roughly 0.5 cm to 7 cm in front of the PIR sensor using their right hand. Participants were not given any instruction on how to perform the gestures (e.g., magnitude or duration), except the direction in which the gestures should be drawn. The start and end of each gesture was indicated by clicking a computer mouse using their left hand. Each gesture was repeated twenty times in each session, which took about 15 minutes to complete. A five-minute break was given between sessions, where participants were asked to leave the desk and walk around the lab. Data collection finished after three sessions. The study took about an hour to complete for each participant. In total, 3600 samples (10 participants×6 gestures×20 repetitions×3 sessions) were collected for analysis.

3.3 Results

The experiment results are described below to demonstrate the accuracy and reliability of the example instantiation of the IR-based gesture sensing and detection system describe above in Section 2.

3.3.1 Within-User Accuracy

Figures 8A, 8B:
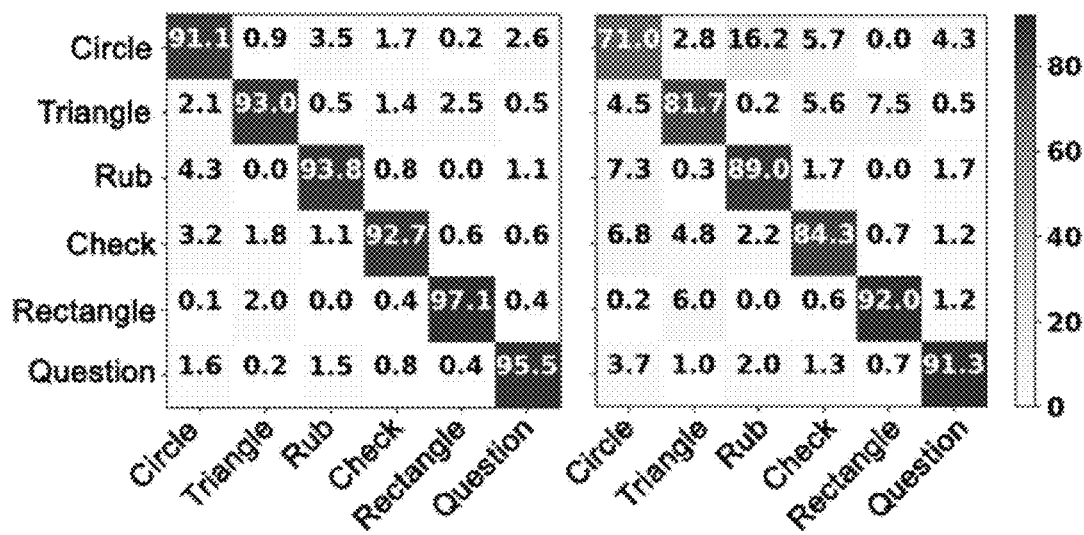
FIG. 8A is a confusion matrix of cross-validation accuracies for the six digit-type gestures illustrated in FIG. 3 from test results performed using the example instantiation of the IR-based gesture sensing and detection system shown in FIG. 6.
FIG. 8B is a confusion matrix of leave-one-session-out accuracies for the six digit-type gestures illustrated in FIG. 3 from test results performed using the example instantiation of the IR-based gesture sensing and detection system shown in FIG. 6.

Within-user accuracy measures the prediction accuracy where the training and testing data are from the same user. For each participant, a twofold cross validation was conducted, wherein half of the data was used for training and the remaining half used for testing. The overall within-user accuracy was calculated by averaging the results from all the participants. The result yielded an accuracy of 93.9% (SD=0.9%). FIG. 8A shows the resulting confusion matrix.

3.3.2 Reproducibility

Reproducibility measures how stable and scalable the system is against the data collected from a different session. To measure the system reproducibility, the leave-one-session-out accuracy was calculated for each participant by training the model using the data from two sessions and testing it using the remaining session. The average accuracy for each participant was calculated by averaging all possible combinations of training and test data. The overall accuracy was then calculated by averaging the accuracy from all participants. The result yields 84.9% accuracy (SD=3.5%). Compared with cross-validation accuracy, this result reflects a more realistic situation. FIG. 8B shows the resulting confusion matrix. Rectangle received the highest accuracy (i.e., 92%) among all six gestures. A potential reason is that the rectangular trajectory has many sharp turns that make the signal more distinguishable than others. The mix of curves and a sharp turn in the question mark may also contribute to the higher accuracy. Most gestures (except rectangle) are more likely to be confused with circle, and vice versa (FIG. 8B). This can be attributed to many factors (e.g., gesture geometry, how gestures were drawn, and recognition algorithm) and requires further investigation. The trend is similar between within-user accuracy and leave-one-session-out accuracy, where rectangle and question mark received higher scores than others, while circle remained the most confusing gesture. These results suggest that gestures with higher accuracy were also drawn more consistently across sessions.

3.3.3 Universality

Figures 9A, 9B:
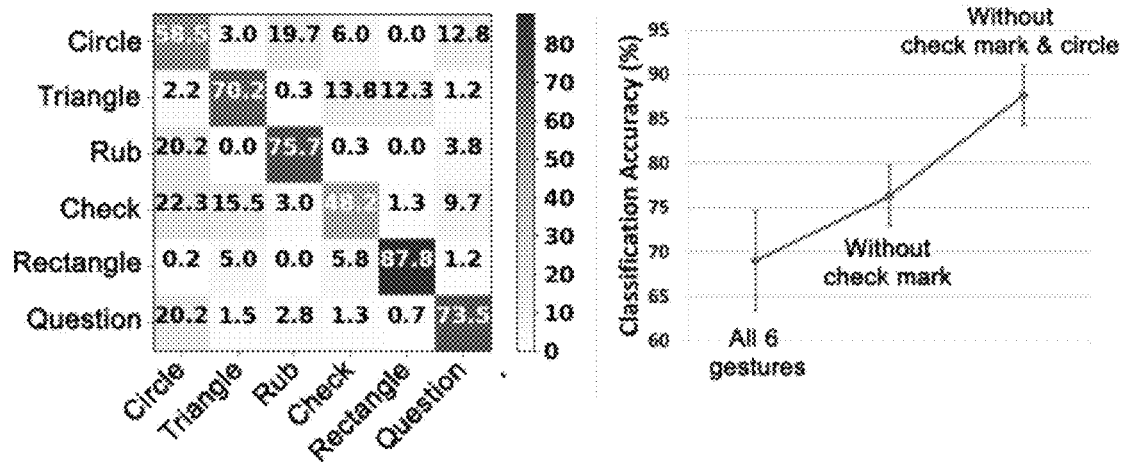
FIG. 9A is a confusion matrix of cross-user accuracies for the six digit-type gestures illustrated in FIG. 3 from test results performed using the example instantiation of the IR-based gesture sensing and detection system shown in FIG. 6.
FIG. 9B is a graph of cross-user accuracy for gestures sets of differing sizes based on the six digit-type gestures illustrated in FIG. 3 from test results performed using the example instantation of the IR-based gesture sensing and detection system shown in FIG. 6.

Universality measures whether an existing model works across different users. To calculate the accuracy, data from nine participants was used for training and data from the remaining participant was used for testing. The overall accuracy was then calculated by averaging the results from all ten combinations of training and test data. The overall accuracy is 69% (SD=11.2%), which indicates that different users performed gestures differently even though the internal consistency is quite high for each individual participant. FIG. 9A shows the confusion matrix of all six gestures, from which we found that check mark (48.2%) and circle (58.5%) contributed the most to the error. The data for the check mark and circle were then removed, and the accuracies using the remaining data were calculated. The result yielded a higher accuracy of 76.3% (SD=6.8%) without check mark and 87.6% (SD=6.7%) without both (FIG. 9B).

3.3.4 Prediction Methods

With the number of differing options available for prediction methods, it was also of interested to measure how well they perform on the data obtained from testing. The collected data was process using four additional methods, including Poly Kernel Support Vector Machine (SVM), RBF Kernel Support Vector Machine, Logistic Regression, and Dynamic Time Warping (DTW), each having different strengths and weaknesses. Hidden Markov Models and Convolutional Neural Networks were not tested, as they require significant computational power, making them less suitable for small computing devices. The prediction accuracy obtained from each method by showing the cross-validation accuracy, leave-one-session-out accuracy, and leave-one-subject-out accuracy are reported in FIG. 10. The result shows that Random Forest outperformed all other tested methods on all three metrics, followed by SVM with a Poly Kernel.

3.4 Environmental Noise

Micro gestures will typically be performed in noisy and inconsistent environments. Thus, initial experiments were conducted in a controlled lab environment to evaluate how robust the example instantiation of the IR-based gesture sensing and detection system is against common environmental noises, such as ambient light and nearby hand movements. Additionally, the impact of rapid changes in hand temperature was also measured. This study was carried out with a single participant (male, right-handed, 25 years old).

3.4.1 Data Collection

The data collection procedure was similar to the user evaluation, except that only two sessions of data were collected. Both sessions were used for training. Since no ambient noise was presented, the prediction model was created under a clean and controlled environment, which was believed to be the easiest way to model in real practice. A goal was to test the performance of this model under varying noise conditions. In total, 240 (6 gestures×20 repetitions×2 sessions) gestures were collected to train our prediction model. Test data was collected in separate sessions under different noise conditions. For both training and testing, the participant performed the gestures roughly 0.5 cm to 7 cm in front of the PIR sensor using his right hand. Room and finger temperatures measured around 23° C. and 35° C. respectively prior to the experiment.

3.4.2 Ambient Light

The PIR sensor used senses thermal infrared with wavelengths ranging from 8 μm to 14 μm, which is not emitted by most indoor light sources (e.g., LED, fluorescent lights) and yet is contained in sunlight. Thus, a focus was on understanding how much sunlight affects the sensing performance. Test data (6 gestures×20 repetitions×2 sessions) was collected under two lighting conditions: dark (0 lx-20 lx, a dark room without any sunlight) and bright (200 lx-300 lx, under sunlight leaked through a window). Data for both conditions were collected indoors to ensure the consistency of the environmental temperature.

The result shows that the clean model achieves 82.5% and 84.2% accuracy in dark and bright condition respectively. This is similar to the leave-one-session-out accuracy in the study noted above, indicating that interferences from ambient thermal infrared have little effect on the sensing performance in our set-up. This is expected because the differential amplifier of the example PIR sensor used canceled out any ambient interference that equally affected both sensing elements.

3.4.3 Nearby Hand Movement

The robustness of the example instantiation of the IR-based gesture sensing and detection system was tested against background hand movements. Another person waved their hand in random trajectories behind the participant's fingers in a distance no further than 30 cm away from the sensor to create background noise. In total, 120 gesture instances (6 gestures×20 repetitions×1 session) were collected for testing. The result was 86.7% accuracy, which is again similar to those found in the other conditions, indicating that background hand movement does not have a negative impact on sensing micro thumb-tip movement in our settings. It is believed this is because 1) the foreground hand blocks background objects from the sensor's viewing angle and 2) the amplifier gain was adjusted to limit sensing long-range motion.

3.4.4 Hand Temperature

Hand temperature may change drastically after the hand holds a hot or cold object (e.g., a cup of a hot or cold drink). To understand whether a rapid, significant change in finger temperature affects sensing performance, the temperature of the participants' fingers was varied by asking the participant to hold a cup of hot water or soak fingers in ice water before performing gestures. In the hot condition, the fingertips measured around 41° C. after holding a cup of hot water for several minutes whereas in the cold condition, the fingertips measured around 24° C. after soaking fingers in ice water for several minutes. The participant started gesturing immediately after the temperature was set. The finger temperature returned to around 36° C. at the end of the hot finger session and 34° C. at the end of the cold finger session.

It was observed that hot fingers did not introduce a visible impact on the analog signal. The resulting 85.8% accuracy further confirmed that a rapid increase in finger temperature does not negatively affect recognition accuracy. In contrast, when the hand was cold, the analog signal became visually weaker. However, the signal quickly returned to the normal scale after the hand temperature reached to 27° C. (within roughly 3 seconds in a room temperature of 23° C.). Although it was found that the overall prediction accuracy was not affected (i.e., 83.3%), the hand temperature increased too quickly to allow us to draw a conclusion. To extend understanding on the effect of cold fingers, another set of gestural data was collected in which the finger temperature was controlled within a range between 24° C. and 26° C. The result yielded 53% accuracy, which suggests that recognition accuracy was affected by the significant drop of hand temperature. It is because a smaller temperature difference between the finger and environment causes weaker signals when hand temperature drops significantly. Thus, the system performance will likely be affected if the model is used in cold temperature conditions, but the issue may go away quickly once the hand returns to a normal temperature.

Overall, the results of this study are encouraging. They provide insights into the pyroelectric infrared sensing in varying usage conditions, and the robustness of our system against tested noises.

3.5 Example Demo Applications

Figure 11:
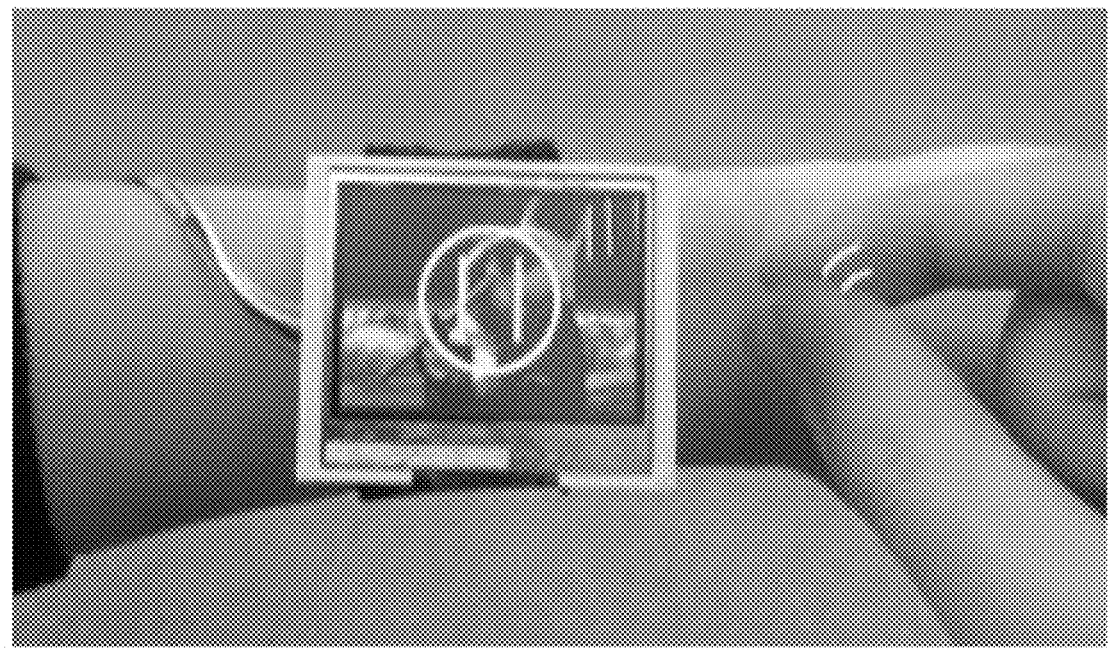
FIG. 11 is a photograph illustrating a user rubbing their fingers together as a control micro gesture to play/pause a video playing on a prototype smartwatch.

Two example demo applications were implemented to showcase the use of the example instantiation of the IR-based gesture sensing and detection system on wearable devices. The first example application was a video player on a smartwatch. A smartwatch prototype was built using a 2" thin-film transistor (TFT) display, a 3D printed case, and the example instantiation of the IR-based gesture sensing and detection system describe above in Section 2. In this example, the user could draw a circle on their index finger with their thumb as a shortcut to launch the video player app. This way, the user doing this did not need to browse an app list on the smartwatch to find the video player app. Unlike existing video players on smartwatches, wherein the control panel can occlude the screen content, the present example allows the user to using thumb-tip gestures to control the video. For example, the user could rub their finger with their thumb to play or pause the video (FIG. 11). Drawing a question mark showed the information of the video, such as title and year.

Figure 12:
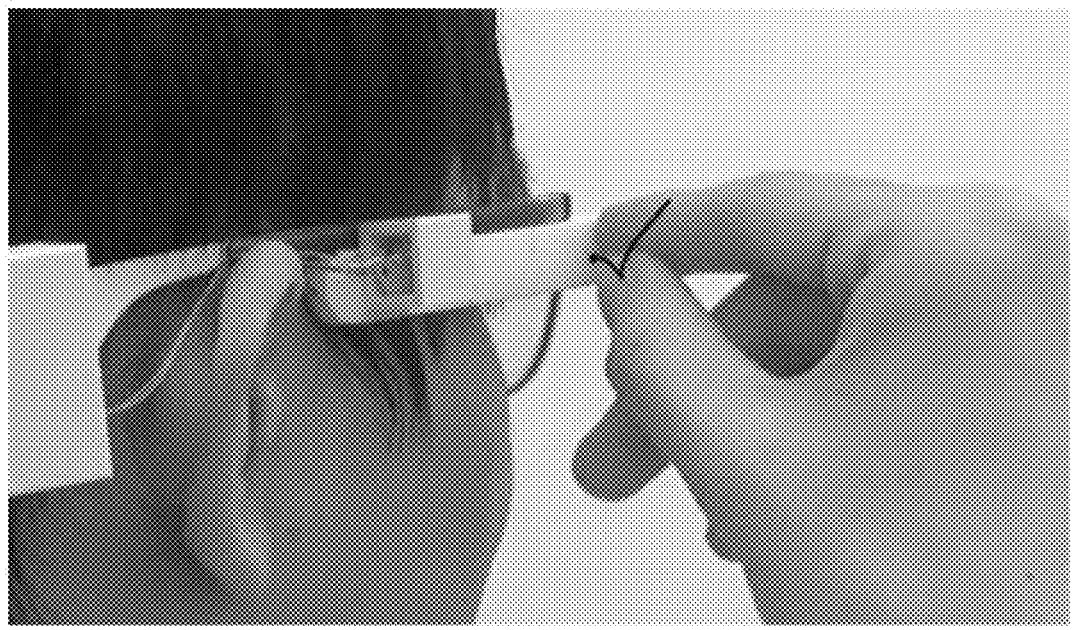
FIG. 12 is a photograph illustrating a user drawing a check-mark-type control micro gesture and touching a touch-pad of a Google Glass headset so as to both take a photograph and post the photograph on the FACEBOOK® social media platform.

The second example application allowed the user to interact with a head-worn display using the thumb-tip gestures. We augmented a Google Glass headset using the example instantiation of the IR-based gesture sensing and detection system described above in section 2. The PIR sensor of the IR-based gesture sensing and detection system was placed beside the touchpad at the rear end of the right-hand temple-piece of the Google Glass headset. The IR-based gesture sensing and detection system provided a new input channel on the Google Glass headset. Additionally, the implementation also allowed the standard Google Glass touchpad and thumb-tip input of the IR-based gesture sensing and detection system to be used jointly. With this new style of joint input, many novel interactions could be performed. For example, thumb-tip gestures performed with and without the index finger touching the touchpad can lead to differing actions by the Google Glass headset. Touching the touchpad in differing locations may also lead to differing actions. In the example application, a check-mark gesture was a shortcut for taking a photo while a check-mark gesture with a finger touching the touchpad not only caused the photo to be taken and but it also caused the photo to be shared on the FACEBOOK® social media platform (FIG. 12). Alternatively, performing a thumb-tip gesture before or after gesturing on the touchpad could trigger different actions. In the example application, rubbing the thumb and index finger before swiping the touchpad zoomed the map in or out whereas swiping without rubbing panned the map.

3.6 Observations

This section presents observations gained from this work.

Gesture delimiter. A focus of much of the foregoing work was on the sensing technique. A gesture delimiter, however, may be desirable in some embodiments to minimize false positive. A number of options exist. For example, distinguishable PIR sensor signals resulting from a hand entering or leaving the PIR sensor's gesture-sensing region may be used as explicit delimiters relative to the control gesture(s) that such hand will perform when the user desires. To quickly validate this method, an informal study was conducted, wherein three male participants (average age: 26.7) were recruited and a two-class classifier (6 micro gestures vs hand-in/out) was trained using 120 samples for each class. Overall, 720 samples (2 class×120 samples×3 participants) were collected for analysis. A two-fold cross validation yielded a 98.6% (SD=0.4%) mean accuracy. In some implementations a hierarchical classifier can include a first classification layer that determines the start or end of a gesture, for example, by determining the entering and exiting of a gesturing hand to and from the gesture-sensing region of the PIR sensor, and a second layer that predicts micro gestures that the user performs within the gesture-sensing region.

False positives. Coarse-grained movements, such as a person passing by a PIR sensor of an IR-based gesture sensing and detection system of the present disclosure, may generate signals similar to hand motions, and, so, an augmentation to the detection algorithms may focus on reducing false positives. Initial tests indicate that body movement more than 40 cm away from the PIR sensor generates much weaker signals that can be distinguished from movement of a gesturing hand into and out of the gesture-sensing region of the PIR sensor. This fact can be used to filter out many ambient motion noise that can occur, for example, in public settings. According to Edward Hall's theory of interpersonal spatial relationships, 40 cm is still within the distance between people in a social environment, so body movements from a nearby colleague or friend may accidentally trigger the delimiter. As described above in Section 1, one solution is to limit the focal length and/or aperture of the lens, typically a Fresnel lens, of the PIR sensor to control the extent of the gesture-sensing region. For example, the focal length of the lens can be chosen so that the object distance from the lens is less than about 30 cm, such as about 20 cm or less or about 10 cm or less. Such short distances can filter out motion noises in many social activities.

Additionally and for example, a smartwatch typically has a built-in mechanism to turn on the screen by detecting the wearer's intention to use the smartwatch. An IR-based gesture sensing and detection system of the present disclosure can, for example, leverage this mechanism and only activate the IR-based gesture sensing and detection system when the smartwatch has its screen turned on. As an example, whirling of the wrist of the hand wearing the smartwatch might introduce false positives. Activating the IR-based gesture sensing and detection system only when the touchscreen is on can reduce the error. Interacting with the touchscreen might also cause false positives. However the smartwatch can deactivate the IR-based gesture sensing and detection system if the smartwatch detects a touch event.

Cross-user model. The results of experimentation show that people may perform the same gesture in different ways. Consequently, a machine-learning model should be trained for each user in order to make use of all six tested gestures and to better deal with user diversity. Additional and/or completely different micro gestures can be used Other embodiments could focus on exploring alternative micro gestures and understanding the parameters in which gestures from different users may vary. Signal variance may also appear between users with and without long fingernails. Some embodiments may be particularly configured to handle such diversity, and further analysis will help identify and extract ad-hoc features to improve the cross-user accuracy.

Customizing PIR sensor. The example instantiation presented in Section 2, above, included a COTS PIR sensor with a pre-configured Fresnel lens. Other embodiments may include customized PIR sensor particularly configured for detecting micro thumb-tip gestures. Such customization can include, but not be limited to, the design of the lens system (e.g., to customize the configuration and extent of the gesture-sensing region), the size(s) of the pyroelectric crystals, as well as their shape, spacing, and orientations, among other things, alternative IR sensor types (e.g., as thermopile IR sensors and quantum sensors), and the electronic circuitry for generating and/or conditioning the gesture-response signal generated by the PIR sensor.

Power. In conducting the present studies, the power consumption of the example instantiation of Section 2, above, was measured. Overall, the customized sensing and detection board consumed 148.1 mW, excluding the BLUETOOTH® radio (99 mW) used to transfer gesture-response signal data to an external laptop computer for feature extraction and gesture classification. The sensing circuitry, i.e., the PR sensor and its analog frontend, alone consumed 2.6 mW.

The current power number is dominated by the TEENSY® framework. In particular, the microcontroller in the framework consumed the most power, as it contains two analog-to-digital converter (ADC) components each operating at a 20-KHz sampling rate at a minimum. Given that example instantiation of the IR-based gesture-sensing system requires only 20-Hz sampling, the system can consume significantly less power by using low-power ADC (for example, the ADS7042 from Texas Instruments supports 1 kHz sampling rate with less than 1 microwatt). Furthermore, the feature extraction and gesture classification algorithms used in the example instantiation were lightweight. Thus, it holds the potential to be run on lower-power microcontrollers.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus, comprising:
at least one passive infrared (PR) sensor configured and positioned to define a gesture-sensing region in free space proximate to the at least one PIR sensor, wherein the at least one PIR sensor includes circuitry that generates a gesture-response signal in response to the at least one PIR sensor sensing a micro gesture made with a heat-radiating object within the gesture-sensing region;
processing circuitry configured to extract a plurality of features from the gesture-response signal generated in response to the micro gesture;
compare the plurality of extracted features to corresponding features of a plurality of predetermined control gestures so as to determine whether or not the plurality of extracted features of the micro gesture matches a particular control gesture of the plurality of predetermined control gestures, wherein the processing circuitry is further configured to execute a machine-learning algorithm that classifies the plurality of extracted features of the micro gesture among the plurality of predetermined control gestures; and
when determining that the micro gesture matches the particular control gesture, generate an indication that corresponds uniquely to the particular control gesture matched.

2. The apparatus according to claim 1, wherein the PIR sensor comprises a pyroelectric material for sensing heat from the heat-radiating object.

3. The apparatus according to claim 1, wherein the heat-radiating object is a human digit, and the at least one PR sensor is tuned to sense IR radiation emitted by the human digit.

4. The apparatus according to claim 1, further comprising a controllable device responsive to the indication so that the controllable device operates in a predetermined way in response to the indication.

5. The apparatus according to claim 4, wherein the controllable device comprises a visual display and the indication controls the controllable device to effect what the visual display displays.

6. The apparatus according to claim 5, wherein the controllable device comprises a wearable electronic device wearable by a person.

7. The apparatus according to claim 5, wherein the controllable device comprises a computing device.

8. The apparatus according to claim 7, wherein the computing device comprises a handheld computing device.

9. The apparatus according to claim 1, wherein the PIR sensor has a central sensing axis, and the gesture-sensing region extends no more than about 40 cm from the PIR sensor along the central sensing axis.

10. The apparatus according to claim 9, wherein the gesture-sensing region extends no more than about 30 cm from the PIR sensor along the central sensing axis.

11. The apparatus according to claim 10, wherein the gesture-sensing region extends no more than about 10 cm from the PIR sensor along the central sensing axis.

12. The apparatus according to claim 9, wherein the PIR sensor includes a lens having a focal length selected to limit the gesture-sensing region to extend no more than the about 40 cm along the central axis.

13. The apparatus according to claim 1, wherein the machine-learning algorithm comprises a Random Forest algorithm.

14. The apparatus according to claim 1, wherein the the processing circuitry is further configured to execute a feature-extraction algorithm that extracts the plurality of features from the gesture-response signal to create the plurality of extracted features wherein the machine-learning algorithm classifies the plurality of extracted features of the micro gesture based on the plurality of extracted features.

15. The apparatus according to claim 14, wherein the processing circuitry is further configured to extract the plurality of extracted features, which include frequency-domain features.

16. The apparatus according to claim 15, wherein the feature-extraction algorithm extracts at least 10 time-domain features and at least 10 frequency-domain features.

17. The apparatus according to claim 1, wherein the PIR sensor has only one lens and the lens is a single-zone lens.

18. A method of controlling a controllable device responsive to a micro gesture made by a user with at least one heat-radiating object, the method comprising:
sensing occurrence of the micro gesture using at least one passive infrared (PIR) sensor so as to generate a gesture-response signal;
extracting a plurality of features from the gesture-response signal generated in response to the micro gesture;
comparing the plurality of extracted features to corresponding features of a plurality of predetermined control gestures so as to determine whether or not the plurality of extracted features of the micro gesture matches a particular control gesture of the plurality of predetermined control gestures, wherein the comparing step comprises classifying the plurality of extracted features of the micro gesture among the plurality of predetermined control gestures using a machine-learning algorithm; and when determining that the micro gesture matches the particular control gesture, generating an indication that corresponds uniquely to the particular control gesture matched.

19. The method according to claim 18, further comprising: communicating the indication to the controllable device; and controlling the controllable device based on the indication.

20. The method according to claim 18, wherein the sensing of the occurrence of the micro gesture occurs when the micro gesture is performed within 40 cm of the PIR sensor along a central sensing axis of the PIR sensor.

21. The method according to claim 20, wherein the sensing of the occurrence of the micro gesture occurs when the micro gesture is performed within 20 cm of the PIR sensor along the central sensing axis.

22. The method according to claim 21, wherein the sensing of the occurrence of the micro gesture occurs when the micro gesture is performed within 10 cm of the PIR sensor along the central sensing axis.

23. The method according to claim 18, wherein the step of extracting the plurality of features includes extracting at least 10 time-domain features and at least 10 frequency-domain features.

24. The method according to claim 18, wherein the machine-learning algorithm includes a Random Forest algorithm.

25. The method of claim 18, further comprising training, using training data, the machine-learning algorithm to classify the plurality of extracted features, prior to performing the classifying step.

* * * * *